United States Patent
Kikuyama et al.

(10) Patent No.: US 6,821,452 B2
(45) Date of Patent: Nov. 23, 2004

(54) ETCHANT

(76) Inventors: Hirohisa Kikuyama, c/o Stella Chemifa Kabushiki Kaisha, 227, Kaisan-cho 7-cho, Sakai-shi, Osaka-fu 590 (JP); Masayuki Miyashita, c/o Stella Chemifa Kabushiki Kaisha, 227, Kaisan-cho 7-cho, Sakai-shi, Osaka-fu 590 (JP); Tatsuhiro Yabune, c/o Stella Chemifa Kabushiki Kaisha, 227, Kaisan-cho 7-cho, Sakai-shi, Osaka-fu 590 (JP); Tadahiro Ohmi, 1-17-301, Komegabukuro 2-chome, Aoba-ku, Sendai-shi, Miyagi-ken 980 (JP)

(*) Notice: Subject to any disclaimer, the term of this patent is extended or adjusted under 35 U.S.C. 154(b) by 0 days.

(21) Appl. No.: 10/609,834

(22) Filed: Jun. 27, 2003

(65) Prior Publication Data

US 2004/0108299 A1 Jun. 10, 2004

Related U.S. Application Data

(63) Continuation of application No. 09/125,440, filed on Aug. 18, 1998, now Pat. No. 6,585,910.

(30) Foreign Application Priority Data

Dec. 18, 1996 (JP) .............................................. 8-338701
Dec. 15, 1999 (JP) .................................. PCT/JP97/04608

(51) Int. Cl.[7] .............................................. C03C 15/00
(52) U.S. Cl. .............................. 216/41; 216/97; 216/99; 216/108; 216/109; 252/79.3; 438/756

(58) Field of Search ............................... 216/41, 97, 99, 216/108, 109; 252/79.3; 438/756

(56) References Cited

U.S. PATENT DOCUMENTS

| 4,795,582 A | | 1/1989 | Ohmi et al. |
| 5,496,485 A | * | 3/1996 | Maternaghan .............. 252/79.3 |
| 5,972,123 A | * | 10/1999 | Verhaverbeke ................. 134/3 |
| 6,068,788 A | * | 5/2000 | Kezuka et al. .............. 252/79.1 |

FOREIGN PATENT DOCUMENTS

| JP | 50-93240 | | 7/1975 | .............. C23F/1/02 |
| JP | 53-126272 | | 4/1978 | ......... H01L/21/302 |
| JP | 4-7832 | A | 1/1992 | ......... H01L/21/308 |
| JP | 4-317331 | | 11/1992 | ......... H01L/21/308 |
| JP | 5-82503 | | 4/1993 | ......... H01L/21/308 |
| JP | 06333912 | A | 12/1994 | ......... H01L/21/308 |
| JP | 07086229 | A | 3/1995 | ......... H01L/21/306 |
| JP | 07115077 | A | 5/1995 | ......... H01L/21/304 |
| JP | 7-506616 | | 7/1995 | ........... C09K/13/06 |
| WO | WO 94/18696 | | 8/1994 | ......... H01L/21/306 |

\* cited by examiner

*Primary Examiner*—Allan Olsen
(74) *Attorney, Agent, or Firm*—Randall J. Knuth

(57) ABSTRACT

An etching agent which can etch insulating film with high speeds without damaging the resist pattern, provide realistic throughput when the insulting film etching process in the semiconductor manufacturing process is replaced with the single wafer processing etching treatment method, and prevent roughness on the surface of the semiconductor after etching.

6 Claims, No Drawings

ETCHANT

CONTINUATION DATA

This application hereby claims the benefit under Title 35, United States Code, §120, and is a Continuation of U.S. application Ser. No. 09/125,44, now U.S. Pat. No. 6,585,910 filed on Mar. 26, 1999 and accepted on Jul. 1, 2003 and is hereby incorporated by reference.

BACKGROUND OF THE INVENTION

1. Field of the Invention

The present invention relates to an etchant and more particularly, to an etching treatment agent used for fine treatment of insulating film such as silicon oxide or the like at a high speed and uniformity in the manufacturing process of semiconductor devices.

2. Description of the Related Art

Cleaning, etching, and patterning of a wafer surface and a finely-manufactured surface with higher cleanliness, higher precision, and more advanced performance are becoming more important with the tendency for increasingly higher integration and higher capability of integrated circuits in the wet process of the manufacturing process for semiconductor integrated circuits.

Both a solution of hydrogen fluoride (HF) and a mixed solution (buffered hydrogen fluoride) of HF and ammonium fluoride ($NH_4F$) are applied for the purpose of cleaning and patterning as a surface treatment agent for fine surface treatment, but in order to acquire submicron ultra high integration, higher performance and higher capability is increasingly required. Further, although the wafer currently averages 8 inches in diameter, it is predicted that the wafer will be 12 inches in diameter by the year 2000.

A wet etching method for a wafer in the conventional case is the batch method of putting 25 to 50 sheets of wafer into a cassette, soaking the whole cassette into an etching bath, and subjecting the cassette to etching treatment. Further, a cassette-less type of cleansing method is employed for preventing drag-in of a solution.

The batch method described above has the advantage of high throughput because of enabling concurrent etching onto a large number of wafers, but has the disadvantage of low uniformity of etching within each surface of the wafers. This low uniformity is more noticeable when the wafer size is larger, such as the 12 inch diameters predicted in the future, and it is conceivably difficult to obtain etching uniformity within the surface of a wafer in current batch processing. In addition, the difficulty will be more serious in accordance with increased tolerance necessary in the art.

And for this reason, in order to enhance etching uniformity, a single wafer processing type etching method in which an etching solution is supplied onto a wafer being rotated has been considered. This method has the advantage of enhancement of the uniformity, but has a disadvantage in that a long time is required for the some throughput as batch processing.

Namely, the buffered hydrogen fluoride solution (BHF) having conventionally been applied is prepared for application usually by mixing 40 percent $NH_4F$ and 50 percent HF in various mixing ratios (such as in a range of 400:1 to 6:1), and etching speeds to silicon oxide film by this BHF are in a range from 27 nm/min to 115 nm/min.

The time required for etching onto 50 sheets of wafer each with oxide film having a thickness of 500 nm in the batch method, with BHF obtained by mixing HF and $NH_4F$ in a ratio, for example, 7:1 is about 5 minutes. But, if the treatment is carried out by the cut sheet type of method with this BHF, the treatment for only one sheet thereof requires about 5 minutes, and so it is understood that the treatment for 50 sheets thereof requires the time 50 times as much as that by the batch method, namely 250 minutes.

Such an enormous time is unrealistic for a line of mass production facilities, and in order to introduce a single wafer processing type etching method into the line of mass production facilities, the treatment time for one sheet has to be reduced. The level of the treatment capability required for the cut sheet type thereof may be decided through the designing of the entire semiconductor manufacturing process, but it is required, at least in order to make throughput maximum, to make wafer passing between devices for treatment smoother so that a retention time is made minimum. For that purpose, at least the same level of treatment capability as that of a dry etching device is required.

The current single wafer processing dry etching process has the capability of etching onto silicon oxide film having a thickness of 500 nm to 1000 nm at around 25 to 30 sheets/hour. Accordingly, an etching solution having the capability of treatment at etching speeds in excess of 200 nm/min is required.

However, the conventional type of etching solution, of which etching speeds are required, dissolves and separates the resist at the same time, and for this reason it is difficult to execute high-speed treatment for a fine pattern on the insulating film.

Conventionally there exists no such etching solution where etching treatment can be effected onto a fine pattern with high speed.

An object of the present invention is to provide, under the situation described above, an etching treatment agent which can etch an insulating film with high speed without damaging the resist pattern.

Another object of the present invention is to provide an etching solution enabling treatment with realistic throughput when the insulating film etching process in the semiconductor manufacturing process is replaced with the single wafer processing etching treatment method.

Further, another object of the present invention is to provide an etching treatment liquid for preventing roughness on the surface of a semiconductor after etching.

SUMMARY OF THE INVENTION

According to the present invention an etchant is applied for the purpose of etching treatment onto insulating film with a resist as a mask formed on a substrate, containing 8 percent by weight through 19 percent by weight of hydrofluoric acid, 12 percent by weight through 42 percent by weight of ammonium fluoride, and a hydrogen ion concentration of $10^{-6.0}$ through $10^{-1.8}$ mol/L. Preferably, the concentration of the hydrofluoric acid is set at 15 percent by weight through 19 percent by weight. An etchant according to the present invention is applied for the purpose of etching onto silicon oxide film with a resist mask formed on a substrate with etching speeds to the silicon oxide film of 200 nm/min or more and a film-reduction rate of the resist of 50 nm/min or less.

Preferably added to the etchant according to the present invention is 0.001 percent by weight through 1 percent by weight of a surfactant.

DETAILED DESCRIPTION OF THE INVENTION

The etching liquid according to the present invention contains 8 percent by weight through 19 percent by weight of HF, 12 percent by weight through 42 percent by weight of $NH_4F$, and a hydrogen ion concentration of $10^{-6.0}$ through $10^{-1.8}$ mol/L.

When the concentration of HF, as well as, $NH_4F$ is set within the range described above, the etching speeds, for example, of silicon thermal oxide film can be set to 200 nm/min or more by adjusting the temperature in the etching solution. Also, by adjusting the hydrogen ion concentration within a range from $10^{-6.0}$ through $10^{-1.8}$ mol/L, the resist separation during the etching treatment can be prevented, and also a resist film-reduction speed can be suppressed to 50 nm/min or less. As a result, it is possible to minimize the error of dimensions of a pattern on the insulating film due to the separation of as well as the thinner resist and to enhance uniformity on the wafer as a whole, so that a high yielding rate of devices with higher performance can be achieved.

It should be noted that crystals may be precipitated in the etching solution depending on its composition; however, the etching solution may be used by heating it up to dissolve the crystals. Also, etching speeds can be enhanced even more by heating the solution to a temperature of 45° C. or less which will minimally affect the reduction of the resist film thickness. By setting the hydrofluoric acid concentration to 15 percent by weight and heating the solution up to the temperature of 35° C. to 45° C. or more, extremely high-speed etching can be realized.

The etching solution according to the present invention can be prepared by mixing $NH_4F$ solution, $NH_4OH$ solution, or $NH_3$ gas with HF solution in a specified ratio, and adding water or the like thereinto, to adjust the concentration and pH.

The etching solution according to the present invention can easily be obtained by mixing, for example, a 50 percent by weight HF solution with a 50 percent by weight $NH_4F$ solution so that HF will be 8 percent by weight through 19 percent by weight.

It is desirable to add a surfactant to the etching liquid according to the present invention, and 0.001 percent by weight through 1 percent by weight thereof is preferably added therein. Addition of the surfactant in the liquid allows roughness on the surface of a semiconductor, exposed after removal of insulating film, to be suppressed. Further, when the pattern is finer, it is hard to wet the insulating film with etching liquid, causing etching uniformity to be reduced, but addition of the surfactant thereinto allows the wetting capability to be improved, thus the etching uniformity is enhanced.

It should be noted that the effect described above is hardly obtained with a rate of adding thereinto the surfactant of 0.001 percent by weight or less, and the same effect is obtained even with the rate of 1 percent by weight or more.

As a surfactant, aliphatic amine ($C_nH_{2n+1}NH_2$; n=7 to 14), aliphatic carboxylic acid ($C_nH_{2n+1}COOH$; n=5 to 11), and aliphatic alcohol ($C_nH_{2n+1}OH$; n=6 to 12) are preferably applied. Those hydrocarbon sections may be a straight chain or a structure having branches. And also, it is especially preferable that at least two types among those three types of surfactant are mixed and that any of the types is selected for application depending on the concentration of $NH_4F$ and HF.

The etching according to the present invention is treated as described below as an example.

The etching solution, according to the present invention, is heated up to a specified temperature, if necessary, so that crystals are not precipitated. The heated liquid is then sent to a nozzle, where it is supplied from the nozzle onto a rotating wafer. The etching solution is supplied while the nozzle is moved between the center and the periphery of the wafer, so that the solution is supplied over the whole wafer. Also, the shift of the nozzle may be omitted by using a one-dimensional nozzle having a length equal to the radius of the wafer.

Further, it is preferable that a megasonic-ultrasonic oscillator is provided in the nozzle and that the etching liquid is supplied while ultrasonic waves in a range from 500 kHz to several MHz are irradiated onto a water. With those operations, etching speeds are even more increased.

As resist treatment before etching is treated with the etching liquid according to the present invention, it is preferable to irradiate ultraviolet rays onto a wafer after development of the resist, and then to subject the wafer to high-temperature baking. With those operations, a film reduction rate can be more suppressed, and finer treatment can be applied with high uniformity.

As a condition of irradiation of ultraviolet rays, the wafer is irradiated with, for example, a UV lamp (220 nm to 320 nm) for 10 to 20 minutes-under the condition of 5 $mW/cm^2$ to 15 $mW/cm^2$.

Also, high-temperature baking is executed preferably in an $N_2$ or Ar gas atmosphere for 10 to 30 minutes at the temperature of 110° C. to 250° C. The baking temperature is more preferably 210° C. to 240° C.

The etching solution according to the present invention can be applied for etching on to insulating film such as silicon oxide films containing P, B, or As, oxide film such as tantalum oxide, and plasma silicon nitride film or the like in addition to silicon thermal oxidation film.

In embodiment one of the present invention, in order to make clear the difference in effects of etching solution composition, etching was carried out using a batch soaking method, and comparison was made between the etching speed and the resist film-reduction rate.

At first, thermal oxidation film was formed on a silicon wafer of approximately 1000 nm, and a photoresist was formed thereon of 1 μm. It should be noted that positive-type resists OFPR800 and TSMR8900 produced by Tokyo Oka were used for a resist.

The resists of various types of pattern having each width of 0.5 μm, 1 μm, and 10 μm respectively were exposed to light, and developed, and then subjected to post-bake treatment, for 30 minutes at the temperature of 130° C. It should be noted that, for an etching solution having a pH of 2.4 or less, after the development, the resist was exposed by ultraviolet rays (8$W/cm^2$) for 15 minutes using a UV deuterium lamp, and high-temperature baking was executed to the resist in an $N_2$ atmosphere for 15 minutes at the temperature of 230° C.

This resist was soaked in etching solutions each having a different composition and at a different temperature for 2 minutes, and an etching speed (nm/min) to silicon thermal oxide film and a resist film-reduction rate or the like were examined. Table 1 indicates the result. The resist film-reduction rates in Table 1 are obtained in relation to OFPR800, but substantially the same result was obtained with TSMR8900, so that TSMR is omitted herein. Peeling off the resist was herein observed with a microscope, and a film-reduction rate was measured with an optical film thickness gage.

It should be noted that each pH of the etching solution is measured at the temperature of 35° C.

TABLE 1

| Solution Composition | | | Etching temperature | | | | | |
|---|---|---|---|---|---|---|---|---|
| | | | 25° C. | | 35° C. | | 45° C. | |
| HF percent by weight | NH$_4$F percent by weight | pH | Etch rate (nm/m) | Film-reduction rate (nm) | Etch rate (nm/m) | Film-reduction rate (nm) | Etch rate (nm/m) | Film-reduction rate (nm) |
| 5 | 0 | <0.8 | 300 | 1000 | 483 | 1000 | 724 | 1000 |
| 5 | 20 | 3.6 | 950 | 0 | 1986 | 0 | 2958 | 0 |
| 7 | 15 | 2.4 | 1290 | 0 | 2235 | 0 | 3316 | 0 |
| 7 | 20 | 3.8 | 1380 | 0 | 2400 | 0 | 3613 | 0 |
| 7 | 35 | 4.4 | 1250 | 0 | 2256 | 0 | 3200 | 0 |
| 8 | 5 | <0.8 | 960 | 1000 | 2012 | 1000 | 2850 | 1000 |
| 8 | 10 | 1.6 | 1460 | 100 | 2530 | *300 | 3230 | 1000 |
| 8 | 12 | 1.8 | 1600 | 10 | 2780 | 10 | 4200 | 15 |
| 8 | 15 | 2.1 | 1750 | 0 | 3215 | 5 | 5360 | 5 |
| 8 | 35 | 4.2 | 1570 | 0 | 2750 | 0 | 4912 | 0 |
| 8 | 42 | 4.4 | 1420 | 0 | 2015 | 0 | 4570 | 0 |
| 10 | 0 | <0.8 | 666 | 1000 | 1094 | 1000 | 1608 | 1000 |
| 10 | 5 | <0.8 | 1396 | 1000 | 2337 | 1000 | 3578 | 1000 |
| 10 | 10 | 1.0 | 1978 | 1000 | 3303 | 1000 | 5475 | 1000 |
| 10 | 15 | 1.8 | 2233 | 5 | 3872 | 10 | 6251 | 10 |
| 10 | 18.5 | 2.4 | 2251 | 0 | 3783 | 0 | 6200 | 0 |
| 10 | 20 | 3.2 | 2185 | 0 | 3818 | 0 | 6122 | 0 |
| 10 | 24 | 3.6 | 2100 | 0 | 3639 | 0 | 6146 | 0 |
| 10 | 28 | 3.8 | 1959 | 0 | 3407 | 0 | 6008 | 0 |
| 10 | 32 | 4.0 | 1810 | 0 | 3164 | 0 | 5294 | 0 |
| 10 | 40 | 5.0 | 1760 | 0 | 2516 | 0 | 4623 | 0 |
| 15 | 20 | <0.8 | 3750 | 1000 | 6495 | 1000 | 10377 | 1000 |
| 15 | 24 | 1.8 | 3817 | 5 | 6381 | 10 | 10541 | 10 |
| 15 | 27 | 2.0 | — | | 6350 | 5 | 10341 | 5 |
| 15 | 27.8 | 2.4 | — | | 6258 | 0 | 10079 | 0 |
| 15 | 35 | 3.6 | 3026 | 0 | 5435 | 0 | 9315 | 0 |
| 18 | 26.3 | 1.7 | — | | 7437 | *300 | 12154 | 500 |
| 18 | 30 | 1.9 | — | | 7213 | 5 | 11960 | 10 |
| 18 | 31 | 2.0 | — | | 7130 | 5 | 12030 | 10 |
| 19 | 20 | 0.9 | 4530 | **500 | 7680 | 900 | 12690 | 1000 |
| 19 | 24 | 1.2 | 4732 | *500 | 7980 | 700 | 13340 | 1000 |
| 19 | 31 | 1.8 | — | | 8016 | 10 | 13416 | 10 |
| 23 | 20 | <0.8 | 5990 | 1000 | 10128 | 1000 | 15885 | 1000 |
| 25 | 20 | <0.8 | 6510 | 100 | 11264 | 1000 | 17514 | 1000 |
| 25 | 25 | <0.8 | 6420 | 100 | 10006 | 1000 | 15900 | 1000 |

In Table 1, any etchant without description of an etch rate indicates a case where crystals were precipitated at the corresponding temperature. Also, the sign (*) indicates a case where a 0.5 μm resist pattern was peeled off, and the sign (**) indicates a case where a resist pattern of 1.0 μm or less was peeled off. The film-reduction rate having 1000 nm indicates a case where the resist was completely dissolved.

As is evident from Table 1, it is found that the etchant according to the present invention can realize high-speed etching, and in addition, the resist separation does not occur, even on a fine pattern, and the film-reduction rate is extremely small.

In addition, in a case where the concentration of hydrofluoric acid is set to 15 percent by weight or more, etching can even more be speeded up, an etching speed of 1 μm/min or more at the temperature of 45° C. can be obtained and also the resist film-reduction rate be suppressed, which provides support for the use of the etchant.

In embodiment two of the present invention, as a resist, a negative type resist (OMR83) produced by Tokyo Oka was used, and similarly to embodiment one, separation of the resist and the film-reduction rate were examined. Table 2 indicates the results. The film-reduction rates are obtained at the liquid temperature of 45° C.

TABLE 2

| HF concentration | NH$_4$F concentration | Film-reduction rate (nm) |
|---|---|---|
| 10 | 0 | 1000 |
| 10 | 5 | 1000 |
| 10 | 10 | 1000 |
| 10 | 15 | 15 |
| 10 | 18.5 | 5 |
| 10 | 20 | 0 |
| 10 | 24 | 0 |
| 10 | 28 | 0 |
| 10 | 32 | 0 |

As shown in Table 2, substantially the same result as that of the positive resist is obtained in the case of the negative resist, and for this reason it is understood that the etching treatment agent according to the present invention also has less solubility to the negative resist.

In embodiment three of the present invention, in order to examine an effect of a surfactant, each silicon wafer was soaked in each of the etching solutions which were heated up to 35° C. for 10 minutes, and surface roughness was examined for each silicon surface exposed when silicon oxide film etched. Table 3 indicates the result.

Herein, as a surfactant the mixture of $C_8H_{17}NH_2$ and $C_9H_{19}COOH$ in an equal molar ratio is added to each of the etching solutions in various concentrations. It should be noted that an atomic force microscope was used for measurement of the surface roughness Ra.

TABLE 3

| HF Concentration | NH₄F concentration | Addition (ppm) | Surface Roughness Ra (nm) |
|---|---|---|---|
| 8 | 35 | 200 | 0.15 |
| 8 | 35 | 0 | 0.55 |
| 10 | 20 | 400 | 0.16 |
| 10 | 20 | 0 | 0.52 |
| 15 | 20 | 400 | 0.17 |
| 15 | 20 | 0 | 0.49 |
| 18 | 30 | 300 | 0.16 |
| 18 | 30 | 0 | 0.55 |
| 19 | 31 | 300 | 0.17 |
| 19 | 31 | 0 | 0.61 |

As is evident form Table 3, it is found that an initial value (0.15 to 0.17 nm) for each surface roughness after the soaking can be maintained by adding a surfactant to the etching solution, and that surface roughness can also be suppressed by the surfactant.

With an etching solution of the present invention, when etching is applied onto oxide film on a surface of a silicon wafer with a photoresist mask formed thereon, etching speeds onto the oxide film can be achieved up to 200 nm/min or more at a temperature of 35° C. and to 1 $\mu$m/min or more at the temperature of 45° C. depending on its composition.

As a result, although the time of around 300 minutes was required for etching by 500 nm onto 50 sheets of wafer in the out sheet method by using the conventional type of 7:1-BHF, the time required for the same treatment can be reduced to 30 minutes on condition that BHF as a high-speed etchant having etching speed of 1 $\mu$m/min while using a temperature of 45° C.

With this reduction, a shift of the etching process from the batch method based on the conventional technology to the cut sheet method can be made quicker, and also uniformity within an etching-treated surface as well as a level of throughput based on the wet process each required by the manufacturing process of a semiconductor device can remarkably be improved.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is

1. A method for etching treatment onto a silicon oxide film formed on a substrate with a resist mask, comprising the steps of:

providing an etchant with a combination having hydrofluoric acid of 8 percent by weight to 19 percent by weight and ammonium fluoride of 12 percent by weight to 42 percent by weight, said combination having a hydrogen ion concentration of $10^{-6.0}$ mol/L to $10^{-1.8}$ mol/L;

etching said silicon oxide film at a rate of at least 200 nm/min; and, setting the film-reduction rate of said resist mask to at most 50 nm/min.

2. The method for etching treatment onto a silicon oxide film formed on a substrate with a resist mask as in claim 1 wherein said etching rate is set by adjusting the temperature in said etchant.

3. The method for etching treatment onto a silicon oxide film formed on a substrate with a resist mask as in claim 1 wherein setting said film-reduction rate of said resist mask is controlled by said hydrogen ion concentration.

4. The method for etching treatment onto a silicon oxide film formed on a substrate with a resist mask as in claim 1 further comprising the step of providing said etchant with a surfactant of 0.0001 percent by weight to 1 percent by weight.

5. The method for etching treatment onto a silicon oxide film formed on a substrate with a resist mask as in claim 1 wherein providing said etchant with hydrofluoric acid of 15 percent by weight to 19 percent by weight.

6. The method for etching treatment onto a silicon oxide film formed on a substrate with a resist mask as in claim 5 further comprising the step of providing said etchant with a surfactant of 0.0001 percent by weight to 1 percent by weight.

* * * * *